(12) United States Patent
Takahashi

(10) Patent No.: US 7,193,329 B2
(45) Date of Patent: Mar. 20, 2007

(54) SEMICONDUCTOR DEVICE

(75) Inventor: Norio Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/283,076

(22) Filed: Oct. 30, 2002

(65) Prior Publication Data

US 2003/0127737 A1     Jul. 10, 2003

(30) Foreign Application Priority Data

Jan. 10, 2002    (JP)    ............................. 2002-003145

(51) Int. Cl.
*H01L 23/48*    (2006.01)
(52) U.S. Cl. ................. 257/781; 257/678; 257/738
(58) Field of Classification Search ................ 257/678, 257/701, 702, 734, 737, 738, 741, 747, 748, 257/778–781, 792; 438/108, 124, 126, 127, 438/612–614
See application file for complete search history.

(56) References Cited

U.S. PATENT DOCUMENTS

| | | | |
|---|---|---|---|
| 5,291,062 A * | 3/1994 | Higgins, III | 257/698 |
| 5,583,378 A * | 12/1996 | Marrs et al. | 257/710 |
| 5,798,050 A * | 8/1998 | Gaynes et al. | 216/20 |
| 6,030,637 A * | 2/2000 | Whitehead | 424/438 |
| 6,031,292 A | 2/2000 | Murakami et al. | |
| 6,107,683 A * | 8/2000 | Castro et al. | 257/700 |
| 6,303,878 B1 * | 10/2001 | Kondo et al. | 174/261 |
| 6,396,136 B2 * | 5/2002 | Kalidas et al. | 257/691 |

FOREIGN PATENT DOCUMENTS

| | | |
|---|---|---|
| JP | 08-172144 | 7/1996 |
| JP | 08-186195 | 7/1996 |
| JP | 08-335593 | 12/1996 |
| JP | 09-036168 | 2/1997 |
| JP | 11-330301 | 11/1999 |
| JP | 2000-031323 | 1/2000 |
| JP | 2001-007236 | 1/2001 |
| JP | 2001-102477 | 4/2001 |

* cited by examiner

*Primary Examiner*—Hung Vu
(74) *Attorney, Agent, or Firm*—Volentine & Whitt, P.L.L.C.

(57) ABSTRACT

The semiconductor device includes a tabular base metal having an insulating layer provided on a bottom surface thereof, and the insulating layer includes a plurality of wiring patterns, each of which is provided with a connecting pad at one end thereof. A semiconductor chip is adhered at a substantial center of the insulating layer with an adhesive. Electrodes provided on a bottom surface of the semiconductor chip are connected to the other ends of the wiring patterns by wire bonding via wires. The semiconductor chip is molded with a resin. The connecting pads are connected to solder balls via an interposer substrate provided with conductors.

15 Claims, 15 Drawing Sheets

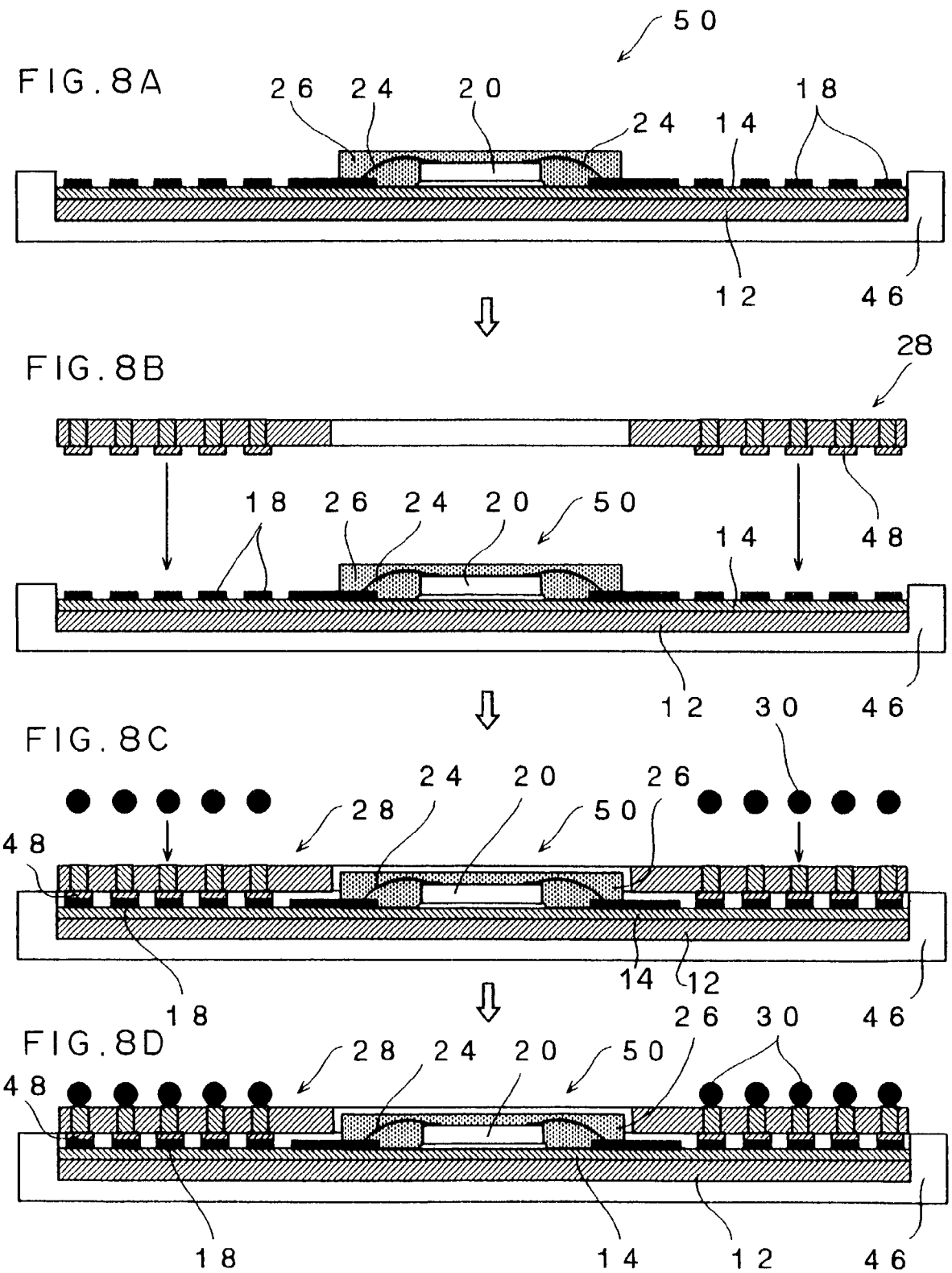

_US 7,193,329 B2_

SEMICONDUCTOR DEVICE

BACKGROUND OF THE INVENTION

1. Field of the Invention

The present invention relates to a semiconductor device, a method for producing a semiconductor device, and a method for producing an interposer substrate. More particularly, the present invention relates to a BGA type semiconductor.

2. Description of the Related Art

A BGA (Ball Grid Array) type semiconductor package has conventionally been proposed, wherein solder bumps serving as external terminals are arranged in a matrix on a back surface of a package, on which a semiconductor chip is mounted. When compared, for example, with a QFP (Quad Flat Package) type semiconductor package where external terminals are arranged around the package, the BGA type semiconductor package can increase a number of the terminals without decreasing the size thereof, thereby contributing to reduce a size of an electronic device.

FIG. 13 shows an example of a conventional BGA type semiconductor package. The semiconductor package 100 shown in FIG. 13 includes an insulating layer 104 made of polyimide, or the like, formed on a base metal substrate 102, and a fine copper wiring 106 is formed on the insulating layer 104. The base metal substrate 102 serves as a ground layer and a heat sink for dissipating heat. A semiconductor chip 108 is adhered to a depression at a center of the package with an adhesive 110 such as a die bonding material. Electrodes on the semiconductor chip 108 are connected to predetermined sites of the copper wiring 106 by wire bonding via wires 112. Solder balls 114 are formed at predetermined sites of the copper wiring 106. The semiconductor chip 108 is sealed by a sealing resin 116.

In the semiconductor package having the above-described structure, there is one wiring layer and a distance between the base metal substrate 102 serving as the ground layer and each site of the copper wiring 106 is substantially the same. Therefore, the semiconductor package having the above-described structure has better electric characteristics and can be produced at a lower cost than a semiconductor package having a multi-layer wiring structure.

Further, a semiconductor device having a structure shown in FIG. 14 is proposed in Japanese Patent Application Laid-Open (JP-A) No. 11-330301. The semiconductor device 200 shown in FIG. 14 includes a semiconductor chip 120 mounted at a center of a wiring resin substrate 118 with a circuit-forming surface of the chip facing away from the wiring resin substrate 118. A top surface of the semiconductor chip 120 is fixed to a heat sink 122 with an adhesive. A conducting portion 124 made of a metal foil is formed on a top surface of the wiring resin substrate 118. Metal foil wiring, which includes pads 126 and inner leads 128, is formed on a bottom surface of the wiring resin substrate 118. The conducting portion 124 is connected to the pads 126 through via holes 130. Tips of the inner leads 128 are connected to bumps 132 serving as electrodes formed on the semiconductor chip 120 by so-called ILB (Inner Lead Bonding). The circuit-forming surface and portions of side surfaces of the semiconductor chip 120, the inner leads 128, and portions of the wiring resin substrate 118 are sealed with a resin 134. Thus, the semiconductor device 200 has a so-called TAB (Tape Automated Bonding) structure.

Furthermore, a semiconductor device 300 having a structure shown in FIG. 15 is proposed in JP-A No. 2000-31323. The semiconductor device 300 shown in FIG. 15 includes a metal plate layer 138 fixed on a heat sink 136 with an adhesive 140. An IC chip 142 is disposed at a center of the metal plate layer 138. A plastic layer 144 is laminated on the metal plate layer 138. A wiring pattern 146 and solder holes 148 are formed on the plastic layer 144. Electrodes provided on a top surface of the IC chip 142 are connected to the wiring pattern 146 by wire bonding via Au leads 150. The electrodes and an upper portion of the wiring pattern 146 are sealed with a sealing resin 152.

However, in the semiconductor package having the structure shown in FIG. 13, bottom surfaces of the solder balls 114 are positioned lower than a lower end of the sealing resin 116, and therefore, a portion of the substrate where the semiconductor chip 108 is mounted has to be formed as a depression by molding using a metal mold, or the like. This leads to an increase in production costs of the semiconductor package. Moreover, since a difference in level is formed at a surface of the semiconductor package 100, if an additional heat sink for dissipating heat is mounted, the heat sink has to be made in a special shape which fits the shape of the semiconductor package 100 having the difference in level, and this may lower a yield of the semiconductor package.

Further, since the semiconductor device having the structure shown in FIG. 14 described in JP-A No. 11-330301 has the TAB structure, it is necessary to form bumps on the semiconductor chip 120, and this increases production costs.

Moreover, in the semiconductor device having the structure shown in FIG. 15 described in JP-A No. 2000-31323, since wire bonding is performed on the wiring pattern 146 formed on the surface which is the same surface as where the solder balls 148 are formed, heights of the Au leads 150 are restricted by heights of the solder balls 148. Therefore, it is difficult to employ double wire bonding, which is employed for semiconductor devices having a large number of electrode pads such as an ASIC, and therefore it is difficult to increase a number of terminals and a degree of freedom in designing this semiconductor device is limited.

SUMMARY OF THE INVENTION

In view of the aforementioned, objects of the present invention is to provide a semiconductor device which can be produced easily and at low costs, and can be designed with a high degree of freedom, as well as a method for producing a semiconductor device and a method for producing an interposer substrate.

In order to accomplish the above described objects, a first aspect of the invention is a semiconductor device comprising: a tabular base substrate having a surface; a wiring pattern formed on the surface of the base substrate and including first and second ends; a semiconductor chip disposed on the surface of the base substrate; an electrode provided on the semiconductor chip, the electrode being electrically connected to the first end of the wiring pattern with a conductive wire; an interposer substrate disposed on the surface of the base substrate, the interposer substrate having an opening, in which the semiconductor chip is positioned; a conductor provided in the interposer substrate and exposed on both of top and bottom surfaces of the interposer substrate, the conductor contacting with the second end of the wiring pattern; and an external electrode electrically connected to the wiring pattern via the conductor, the external electrode with the conductor exposed on the other surface of the interposer substrate.

According to the invention, the wiring pattern is formed on the tabular base substrate. The base substrate may comprise an insulating layer formed on a conductive substrate. Thus, the base substrate can serve as a so-called heat sink and a ground layer.

The semiconductor chip is disposed on the base substrate. One of ends of the wiring pattern is connected to the electrode provided on the semiconductor chip, for example, by wire bonding.

Further, the interposer substrate is disposed on the base substrate. The interposer substrate includes the opening, in which the semiconductor chip is positioned, and the conductor, one of whose ends is electrically connected to the other of the ends of the wiring pattern and the other of whose ends is exposed at the surface which is different from the surface contacting the base substrate. The one end of the conductor is electrically connected to the other end of the wiring pattern by being connected or contacted, and the other end of the conductor is connected to the external electrode. In this manner, the external electrode is electrically connected to the electrode on the semiconductor chip. It should be noted that the opening provided in the interposer substrate may be a hole or a depression having a size sufficient for accommodating the semiconductor chip.

As described above, since the interposer substrate including the opening for accommodating the semiconductor chip is disposed on the base substrate, the base substrate can have a tabular shape, i.e., the base substrate need not be formed in a special shape. Therefore, a semiconductor package can be produced inexpensively.

Further, since the electrode on the semiconductor chip is connected to the wiring pattern by wire bonding, there is no need of providing the semiconductor chip with bumps as in the conventional semiconductor device shown in FIG. 14. Therefore, increase in production costs can be suppressed.

Furthermore, since the wiring pattern is formed on the base substrate, heights of positions of the wires are not restricted by diameters of the solder balls as they are in the conventional semiconductor device shown in FIG. 15. Therefore, a degree of freedom in design can be increased.

The conductor may comprise a conductive material embedded in a through hole provided in the interposer substrate.

Moreover, the conductor may comprise a conductive film formed on a side wall of the through hole provided in the interposer substrate, and a conductive connecting pad disposed over the through hole and electrically connected to the conductive film. In this case, a filler may be filled in the through hole having the conductive film formed therein. In this manner, a highly strong connecting pad can be obtained.

Further, the conductor may comprise a conductive film formed on the side wall of the through hole provided in the interposer substrate, a conductive connecting pad disposed at a position offset from the through hole, and a connection wiring pattern for electrically connecting the conductive film to the connecting pad. Thus, the connecting pad and the connection wiring pattern can be formed, for example, by photolithography similarly to an ordinary printed wiring board.

A second aspect of the invention is a method for producing the semiconductor device comprising the steps of: mounting a semiconductor chip on a tabular base substrate with wiring patterns formed thereon, the semiconductor chip including electrodes for connecting to one ends of the wiring patterns; connecting the electrodes to the other ends of the wiring patterns by wire bonding via wires; mounting an interposer substrate on the base substrate, the interposer substrate comprising an opening, in which the semiconductor chip is positioned, and conductors, whose one ends are electrically connected to the other ends of the wiring patterns and whose other ends are exposed at a surface which is different from a surface contacting the base substrate; and forming external electrodes on the exposed conductors.

Further, the above-described steps may be performed after the base substrate is set in a carrier jig including depressions having a size substantially the same as an outline of the base substrate and a depth greater than a thickness of the base substrate. Thus, the interposer substrate is at least partially set in the carrier jig, and there is no need of strict alignment between the interposer substrate and the base substrate. Therefore, the interposer substrate and the base substrate can be aligned with each other easily and accurately.

The interposer substrate can be produced by the steps of: inserting the linear conductive material in a tube-like container having a size larger than the outline of the base substrate and including a bottom surface having a predetermined shape; pouring a liquid insulative material into the container; and cutting the insulative material in a direction perpendicular to a longitudinal direction of the container after the insulative material has been cured. There may be pieces of the linear conductive material, which are arranged at predetermined intervals, inserted in the container. In this way, the interposer substrate can be produced easily and inexpensively. Further, the container may have a bottom surface of a size equal to or larger than the outline of the base substrate. After the cutting step, the insulative material may be further cut according to the size of the base substrate, and an opening of a size corresponding to the size of the semiconductor chip may be formed in the insulative material. In this manner, interposer substrates having various sizes can be produced.

BRIEF DESCRIPTION OF THE DRAWINGS

FIGS. 8A–8D are diagrams for explaining a process for producing the semiconductor device.

DESCRIPTION OF THE PREFERRED EMBODIMENTS (First Embodiment)

Figure 1:
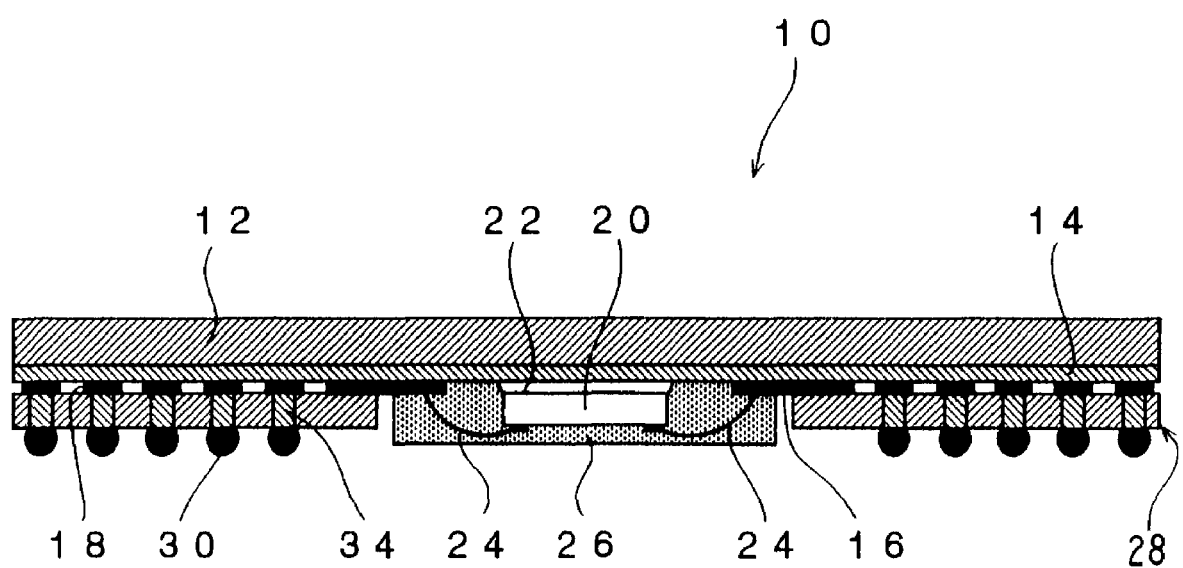
FIG. 1 is a sectional view of a semiconductor device.

A first embodiment of the present invention will now be described with reference to the drawings. FIG. 1 shows a sectional view of a semiconductor device 10 according to the invention, and FIG. 2 shows an exploded view of the semiconductor device of FIG. 1.

Figure 2:
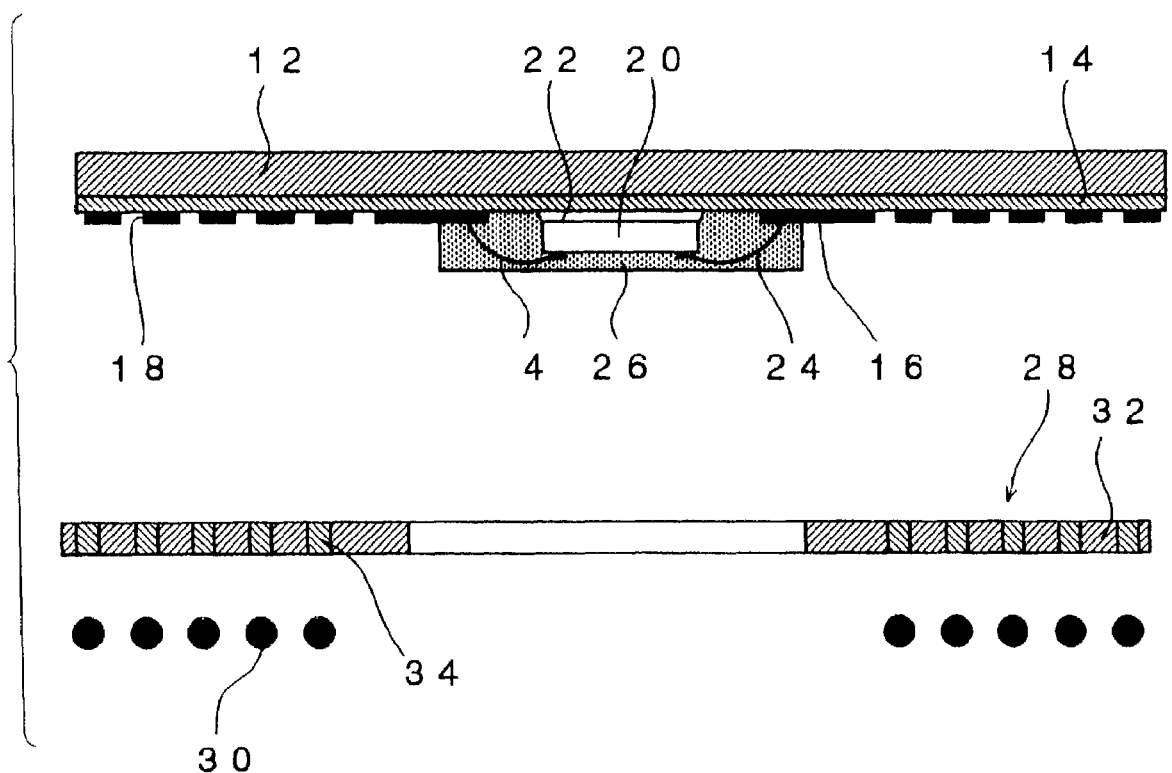
FIG. 2 is an exploded view of the semiconductor device.

As shown in FIGS. 1 and 2, the semiconductor device 10 is provided with an insulating layer 14 made of a resin such as polyimide formed on a bottom surface of a tabular base metal 12. It should be noted that the base metal 12 and the insulating layer 14 may be hereinafter generally referred to, in combination, as a base substrate.

The insulating layer 14 includes a plurality of wiring patterns 16 made of a metal foil such as copper, and a connecting pad 18 is disposed at one end of each of the wiring patterns 16. Further, a semiconductor chip 20 is adhered at a substantial center of the insulating layer 14 with an adhesive 22 such as a die bond. Electrodes provided on a bottom surface of the semiconductor chip 20 are connected to other ends of the wiring patterns 16 by wire bonding via wires 24 such as Au leads. The semiconductor chip 20, the wires 24 and portions of the wiring patterns 16 are sealed with a resin 26.

Figure 3:
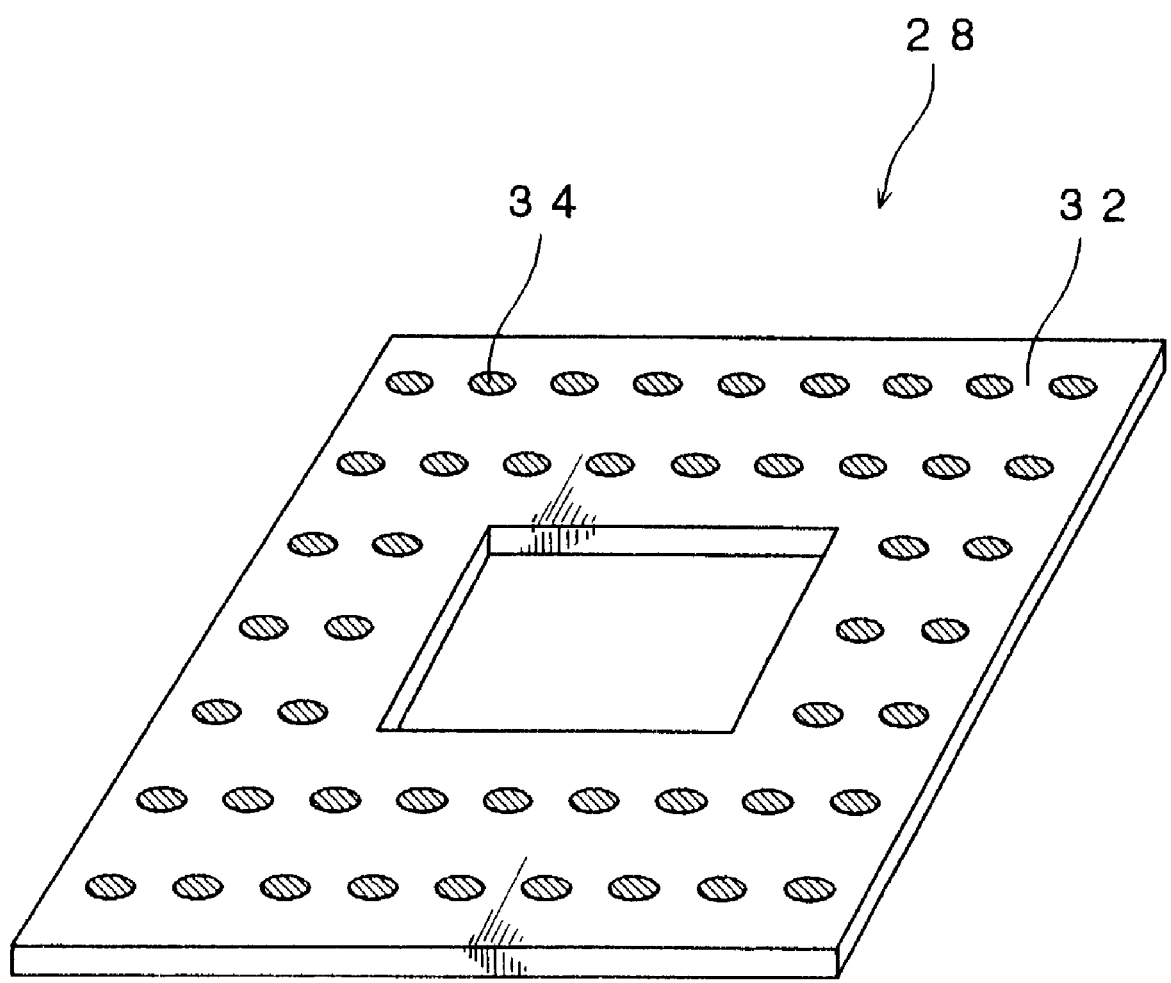
FIG. 3 is a perspective view of an interposer substrate.

The connecting pads 18 are connected to solder balls 30 via an interposer substrate such as shown in FIG. 3. The connecting pads 18 are arranged in a matrix at predetermined intervals, for example, 1 mm or 1.27 mm intervals, which is specified by standards such as JEDEC (Joint Electron Device Engineering Council) and JEITA (Japanese Electronics and Information Technology Industries Association). It should be noted that the solder balls 30 may be hereinafter generally referred to as external electrodes.

The interposer substrate 28 is structured so that a plurality of conductors 34, which are arranged on a substrate 32 such as a resin substrate at the same intervals as that of the connecting pads 18, are extend through the substrate 32 and are exposed at both top and bottom surfaces of the substrate 32. An opening is formed at a center of the interposer substrate 28 so as to correspond to a position of the semiconductor chip 20 on the base substrate. Further, the conductors 34 are disposed at positions corresponding to positions of the connecting pads 18 on the base substrate. It should be noted that the conductors 34 may be hereinafter generally referred to as conducting portions.

The substrate 32 is made of an insulative material such as an epoxy resin having predetermined moisture resistance and heat resistance. The conductors 34 are made of a metal such as copper. A size of the interposer substrate 28 is, for example, 25–40 mm square, and a thickness thereof depends on sizes of the semiconductor chip 20 and the solder balls 30, and is sufficient for a lower end of the resin 26 not to extend below the solder balls 30. For example, as shown in FIG. 1, the thickness of the interposer substrate 28 is about the same as the thickness of the semiconductor chip 20 (for example, about 0.3–5 mm). Thus, the lower end of the resin 26 does not extend below the solder balls 30, and the semiconductor device 10 can be appropriately mounted on a wiring board (not shown).

Figure 13:
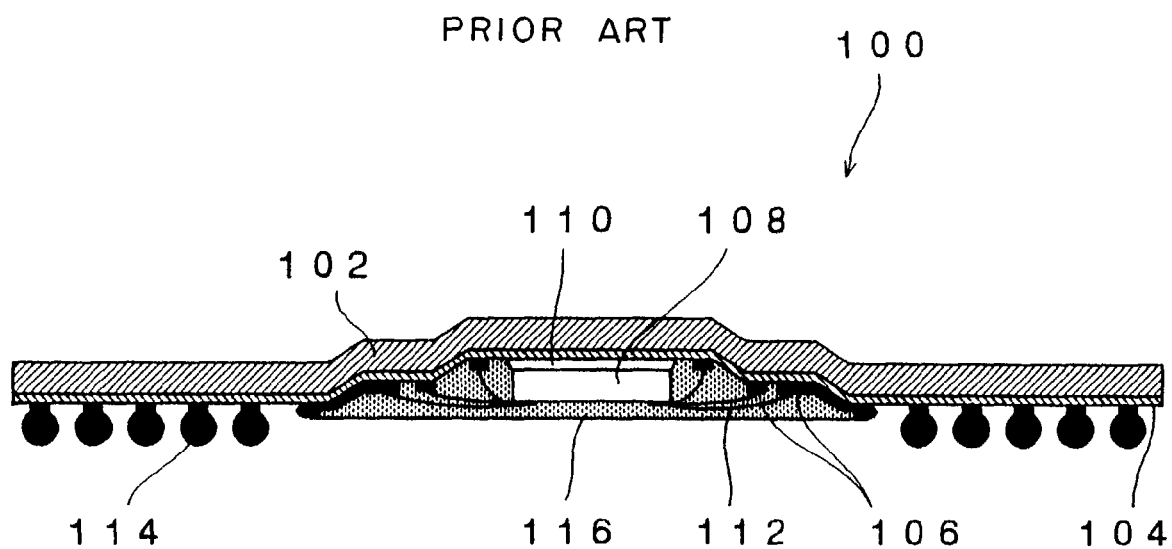
FIG. 13 is a sectional view of a conventional semiconductor device.

As described above, since the base metal 12 has a tabular shape, there is no need of processing the base metal and making the heat sink to be attached in a special shape as there is in the conventional semiconductor device shown in FIG. 13, thereby facilitating attachment of the heat sink to the base metal. Thus, lowering of a yield of the semiconductor package can be suppressed.

Figure 14:
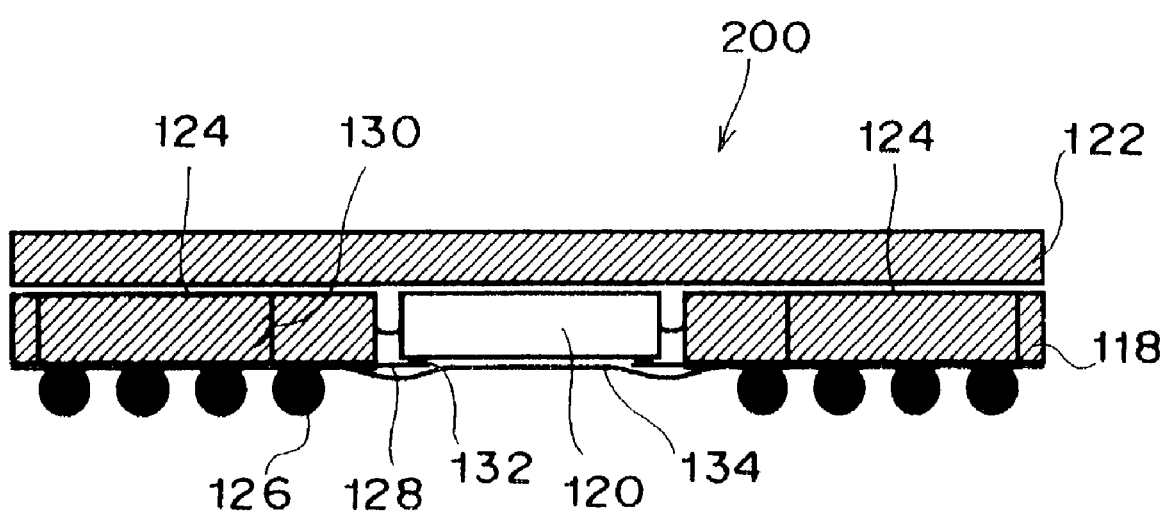
FIG. 14 is a sectional view of a conventional semiconductor device.

Further, since the wiring patterns 16 are connected to the electrodes on the semiconductor chip 20 by wire bonding, there is no need to provide bumps on the semiconductor chip 20 as there is in the conventional semiconductor device shown in FIG. 14, thereby suppressing production costs of the semiconductor package.

Figure 15:
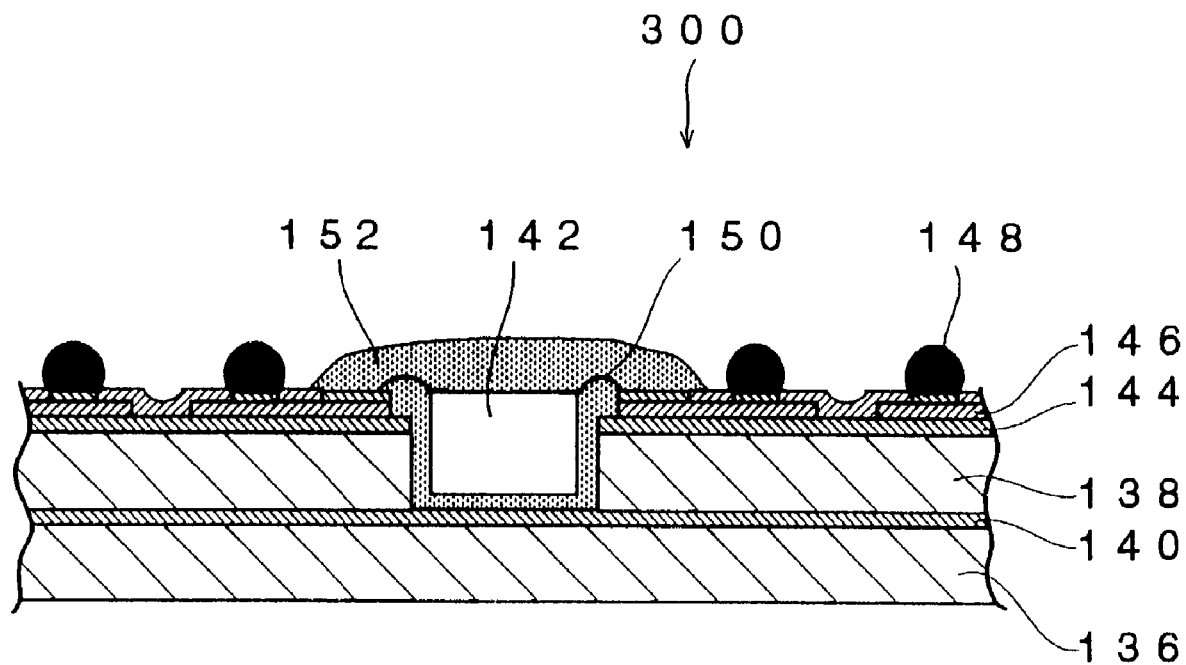
FIG. 15 is a sectional view of a conventional semiconductor device.

Furthermore, the wiring patterns 16 are positioned nearer to the base metal 12 than the semiconductor chip 20. Therefore, heights of (positions of) the wires 24 are not restricted by diameters of the solder balls 30 as they are in the conventional semiconductor device shown in FIG. 15. Therefore, if the thickness of the interposer substrate 28 is increased, double wire bonding can be performed, thereby increasing a degree of freedom in design.

Figure 4:
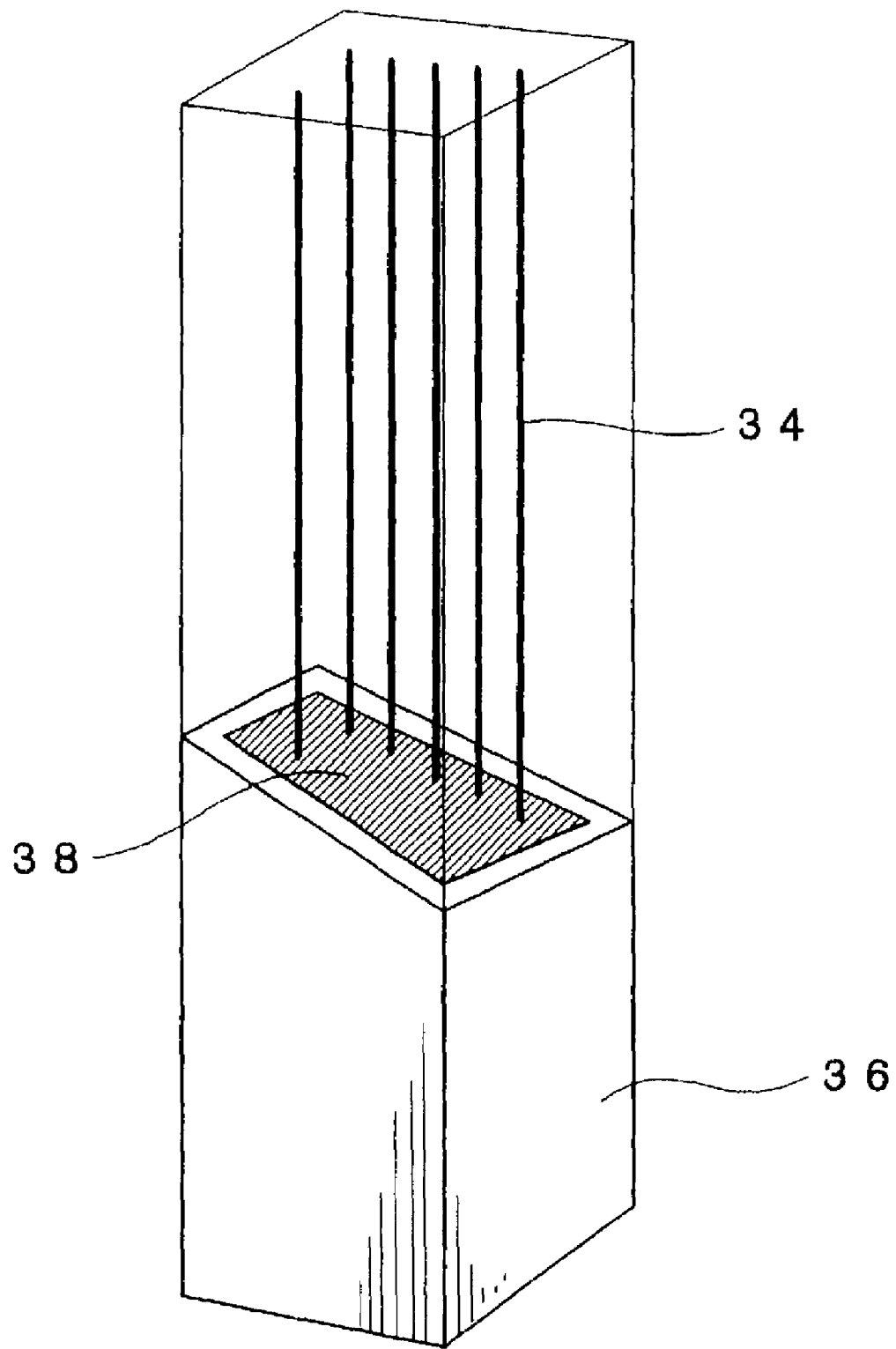
FIG. 4 is a diagram for explaining how the interposer substrate is produced.

The interposer substrate 28 can be produced, for example, in the following manner. First, as shown in FIG. 4, into a rectangular parallelopipedic container 36 having a bottom surface, which is larger than a size of the semiconductor device assumed to be produced, the conductors 34 having a length being substantially the same as a length of the container 36, of a number at least the same as a number of the connecting pads 18, are arranged straight without slack at the same intervals as those of the connecting pads 18. Then, a resin 38 such as an epoxy resin is poured into the container 36.

Figure 5:
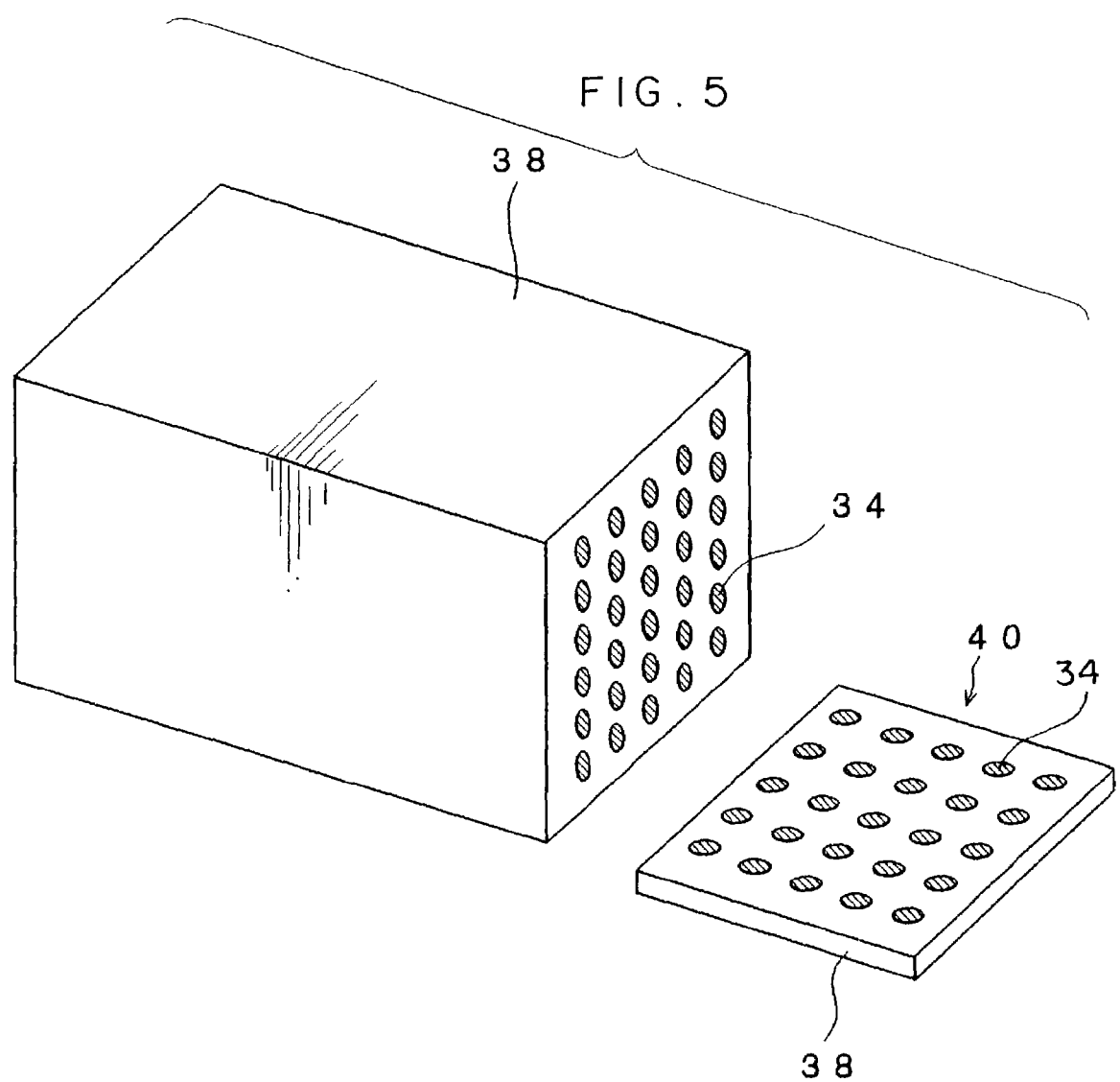
FIG. 5 is a diagram for explaining how the interposer substrate is produced.

After the resin 38 is cured, it is taken out from the container 36 as shown in FIG. 5, and is sliced in a direction perpendicular to a longitudinal direction of the resin 38 in a thickness of about 0.3–5 mm.

A tabular substrate 40 thus obtained is subjected to surface cleaning, surface polishing and the like, as necessary, to remove contamination, burr and the like.

Figure 6:
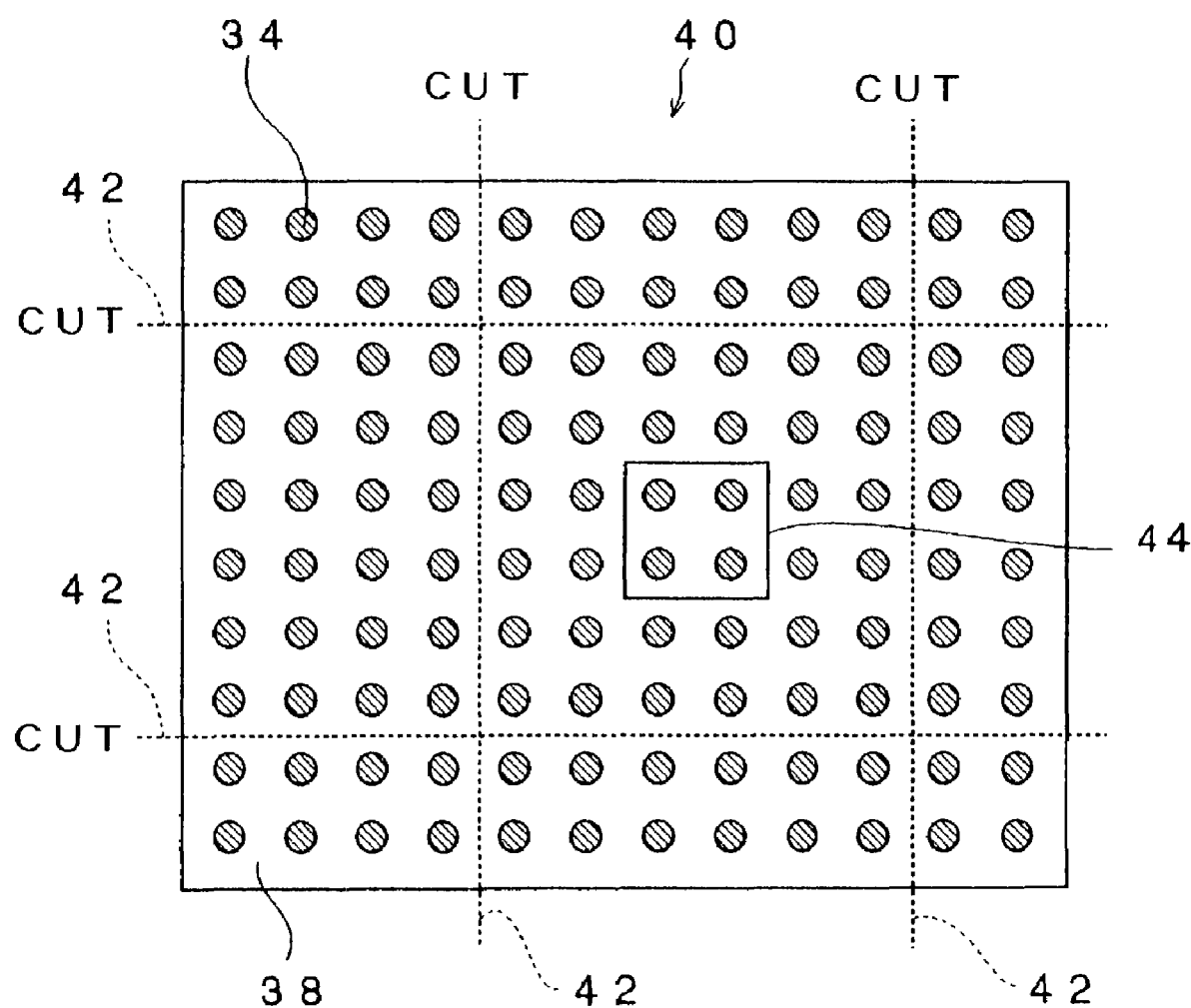
FIG. 6 is a diagram for explaining how the interposer substrate is produced.

Subsequently, as shown in FIG. 6, the substrate 40 is cut along cut lines 42 to a size substantially the same as a size of the base metal 12.

Then, the opening is formed in an area 44 corresponding to an area on the base substrate sealed with the resin 26 by punching (punching using a metal pattern) or router machining (cutting). By punching, the opening can be made easily and in a short time, and by router machining, the opening can be smoothly finished.

As described above, since the interposer substrate 28 can be produced by machining the substrate 40 according to the sizes of the semiconductor chip 20 and the base metal 12, if the substrate 40 is produced in a manner of mass-production, versatility of the mass-produced substrate 40 can be maintained and a degree of freedom in design can be increased.

It should be noted that the container 36 may have a shape which is fitted to the sizes of the semiconductor chip 20 and the base metal 12, and the resin 38 may be filled in the container 36 to be cured, and is sliced to produce the interposer substrate 28. In this manner, punching or router machining is not necessary, and therefore the production process can be simplified.

Next, a method for producing the semiconductor device 10 using the above-described interposer substrate 28 is described.

First, the insulating layer 14 is formed on the base metal 12, and a metal foil layer is formed thereon. The insulating layer 14 and the metal foil layer can be formed by various known methods, and examples thereof include CVD (Chemical Vapor Deposition), PVD (Physical Vapor Deposition), coating, plating, and the like.

Next, a photoresist, which is a photosensitive resin having a sufficient sensitivity to a wavelength corresponding to, for example, the ultraviolet region, is coated on the metal foil layer by spin coating, or the like. Then, the photoresist is exposed to light according to a wiring pattern, and thereafter, is developed to remove unnecessary portions of the photoresist. Subsequently, unnecessary portions of the metal foil are removed by etching. Thus, the wiring patterns 16 are formed. It should be noted that, in the photoresist process, either of a negative or positive type photoresist may be used.

Next, the connecting pads 18, which serve as electrodes, are formed on the wiring patterns 16 at predetermined intervals. Then, the semiconductor chip 20 is adhered at the substantial center of the insulating layer 14 with the adhesive 22, and the electrodes on the semiconductor chip 20 are connected to the wiring patterns 16 by wire bonding via the wires 24.

Subsequently, the semiconductor chip 20, the wires 24 and portions of the wiring patterns 16 are sealed with the resin 26.

Figure 7:
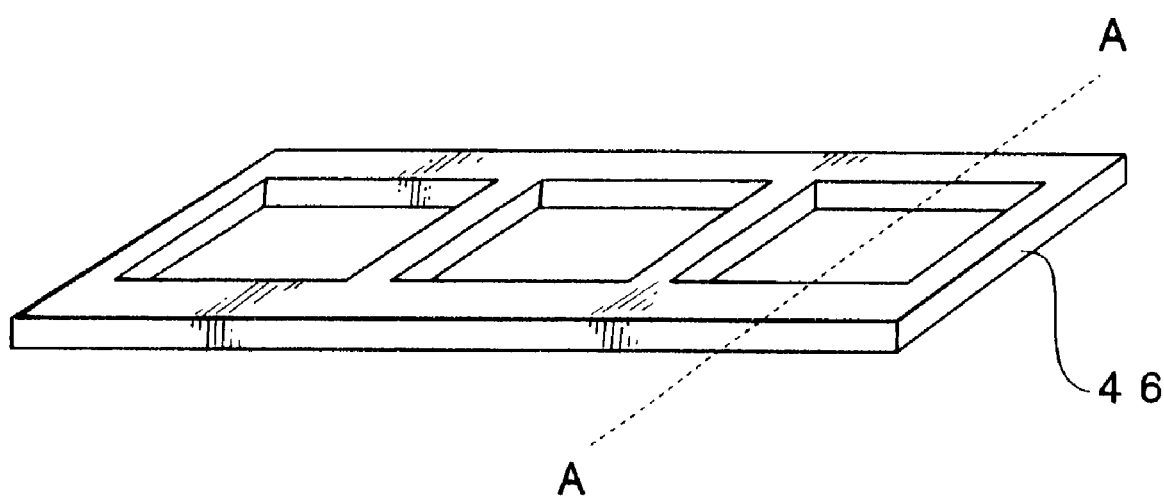
FIG. 7 is a perspective view of a carrier jig.

A substrate 50 thus produced is set in one of depressions of a carrier jig 46 shown in FIG. 7. That is, as shown in FIG. 8A, the substrate 50 is set in the depression of the carrier jig 46 with the side thereof where the semiconductor chip 20 is mounted facing up. FIGS. 8A–8D are sectional views of the substrate 50 being set in the carrier jig 46 shown in FIG. 7 taken along line A—A.

Next, as shown in FIG. 8B, pieces of solder paste 48 are printed by screen printing, or the like, on all of the conductors 34, which are exposed at one side of the interposer substrate 28. Then, the interposer substrate 28 is set in the depression of the carrier jig 46 with the side having the pieces of solder paste 48 printed thereon facing down.

As shown in FIG. 7, the carrier jig 46 is provided with a plurality of depressions, in which a plurality of substrates can be set at the same time. The depressions may be arranged in a line as shown in FIG. 7, or may be arranged in a matrix.

A size (length×width) of each of the depressions of the carrier jig 46 is substantially the same as that of the base metal 12. A depth of each depression is greater than a sum of thicknesses of at least the base metal 12 and the insulating layer 14. In this manner, the interposer substrate 28 is set at least partially in the depression, and at this time, positions of the conductors 34 on the interposer substrate 28 and those of the connecting pads 18 are respectively aligned. Therefore, alignment is carried out only by setting the interposer substrate 28 in the depression, and there is no need of a strict alignment procedure. The semiconductor chip 20 is sealed with the resin 26 in advance, and the resin 26 and the interposer substrate 28 are spaced apart from each other.

Next, as shown in FIGS. 8C and 8D, a flux is applied on the solder balls 30 or on the conductors 34 of the interposer substrate 28, and the solder balls 30 are mounted using a mounter. Thereafter, the carrier jig 46 is passed through a reflow furnace for a reflow treatment.

In this manner, the semiconductor device 10 is produced. It should be noted that, although the sealing of the semiconductor chip 20 with the resin 26 is performed before the interposer substrate 28 is set and the solder balls 30 are mounted in this embodiment, the resin 26 may be poured to seal the semiconductor chip 20 after the interposer substrate 28 is set.

(Second Embodiment)

A second embodiment of the invention will now be described. In the second embodiment, a modification of the interposer substrate is described. It should be noted that parts of the interposer substrate of the second embodiment which are the same as those of the interposer substrate of the previous embodiment are designated by the same reference numerals, and are not described in detail.

Figure 9A:
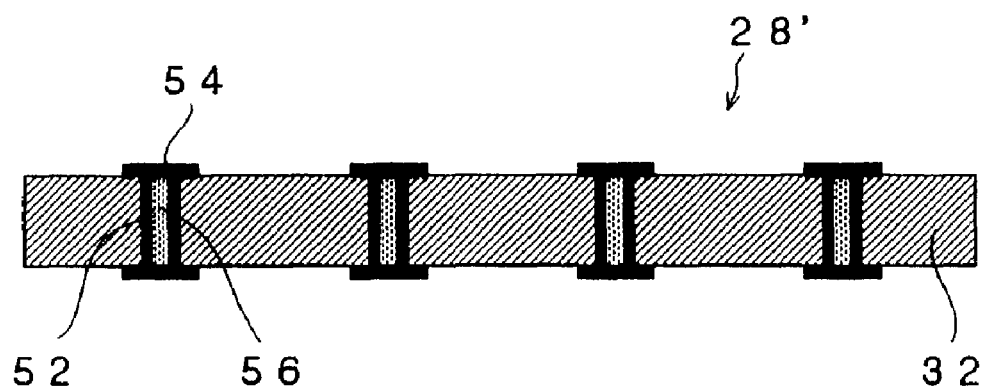
FIG. 9A is a sectional view of an interposer substrate according to a modification of the present invention.
Figure 9B:
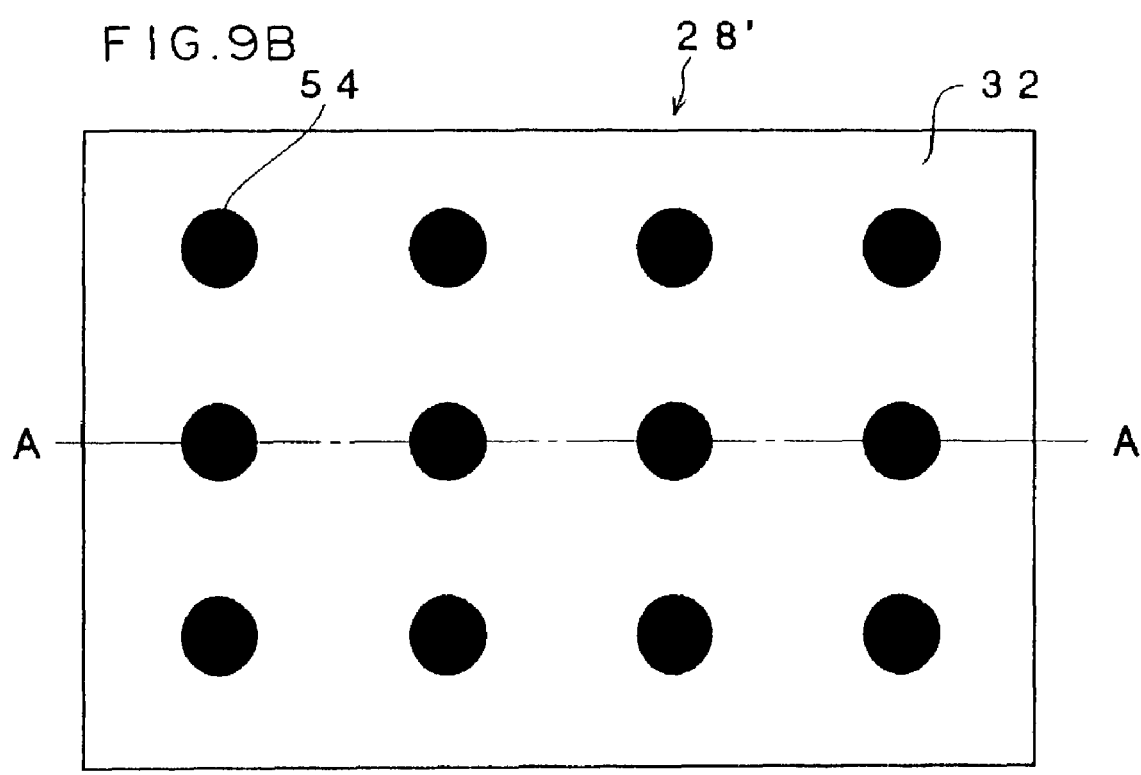
FIG. 9B is a plan view of the interposer substrate.

FIG. 9A is a partial sectional view of an interposer substrate 28' according to the modification, and FIG. 9B is a plan view thereof. The sectional view in FIG. 9A is taken along line A—A in FIG. 9B.

As shown in FIG. 9A, the interposer substrate 28' includes through holes 52 formed in the substrate 32, and connecting pads 54 formed at both ends of the through holes 52. That is, the through holes 52 are closed by the connecting pads 54. A filler 56 is filled in each of the through holes 52. As the filler 56, an insulative material such as epoxy or a conductive material such as copper paste or silver paste can be used. In the interposer substrate 28' of the embodiment, the connecting pads 54 cover the through holes 52. Since the filler 56 comprising an insulative material such as epoxy or a conductive material such as copper paste or silver paste is filled in each of the through holes 52 in the interposer substrate 28' of the invention, the connecting pads 54 are prevented from breaking, which otherwise may be caused by thermal expansion of air existing in the through holes 52 during a heat treatment after formation of the through holes.

As the substrate 32, a double-face substrate which is excellent in machinability, dimensional accuracy, moisture resistance and heat resistance, such as those having, for example, grade FR-4 in the NEMA standard, which grade represents a grade of a substrate. By using a standardized versatile substrate, the interposer substrate is produced inexpensively.

Further, by arranging the connecting pads 54 at intervals specified by a standard such as JEDEC, versatility of the interposer substrate is increased, and therefore, interposer substrates can be mass-produced and stored. Moreover, in the embodiment, since the connecting pads 54 are disposed over the through holes 52, an interposer substrate with a distance between each of the conducting portions being small may be provided.

Next, a method for producing the interposer substrate 28' is described.

Figure 10A:
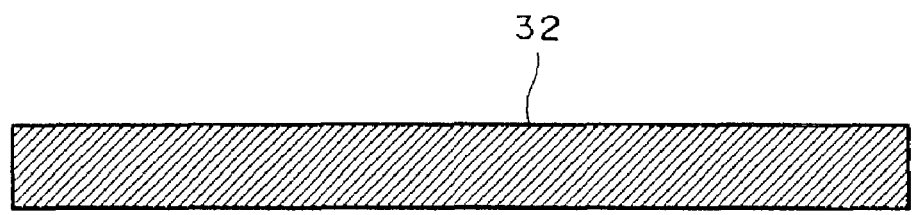
FIGS. 10A–10E are diagrams for explaining a process for producing the interposer substrate according to the modification of the invention.
Figure 10B:
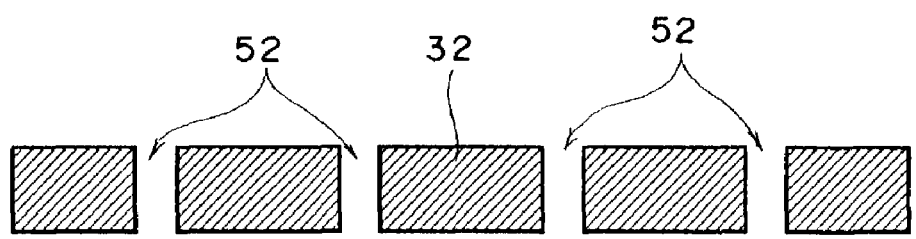
Figure 10C:
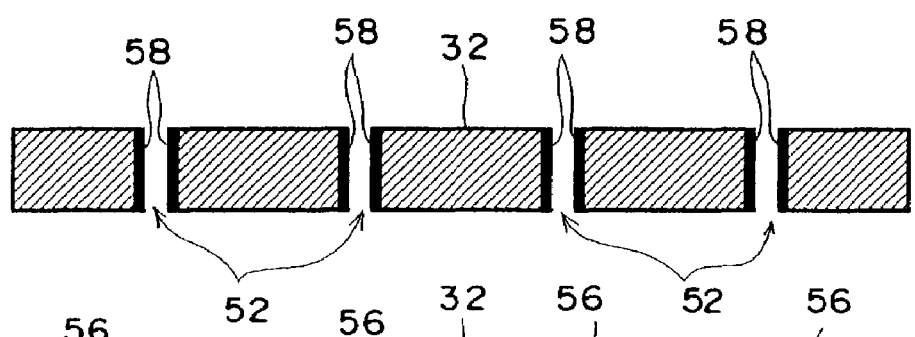
Figure 10D:
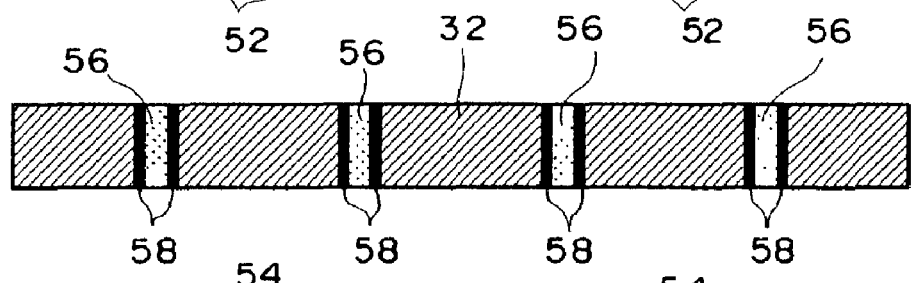
Figure 10E:
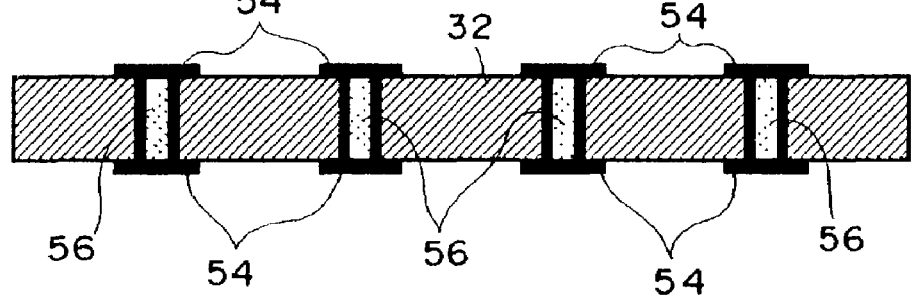

First, the substrate 32 shown in FIG. 10A is provided with the through holes 52 as shown in FIG. 10B, for example, by drilling. Then, as shown in FIG. 10C, a conductive film 58 is formed on an inner wall of each of the through holes 52, and the filler 56 is filled in each of the through holes 52 as shown in FIG. 10D. Then, as shown in FIG. 10E, the connecting pads 54 are formed at both sides of the through holes 52, for example, by printing. It should be noted that the connecting pads 54 may be formed without filling the filler 56 in the through holes 52.

(Third Embodiment)

A third embodiment of the invention will now be described. In the third embodiment, another modification of the interposer substrate is described. It should be noted that parts of the interposer substrate of the third embodiment which are the same as those of the interposer substrate of the previous embodiments are designated by the same reference numerals, and are not described in detail.

Figure 11A:
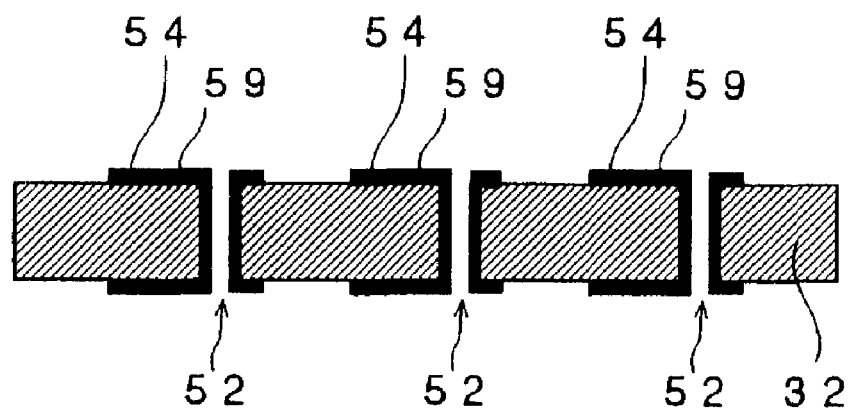
FIG. 11A is a sectional view of an interposer substrate according to another modification of the invention.
Figure 11B:
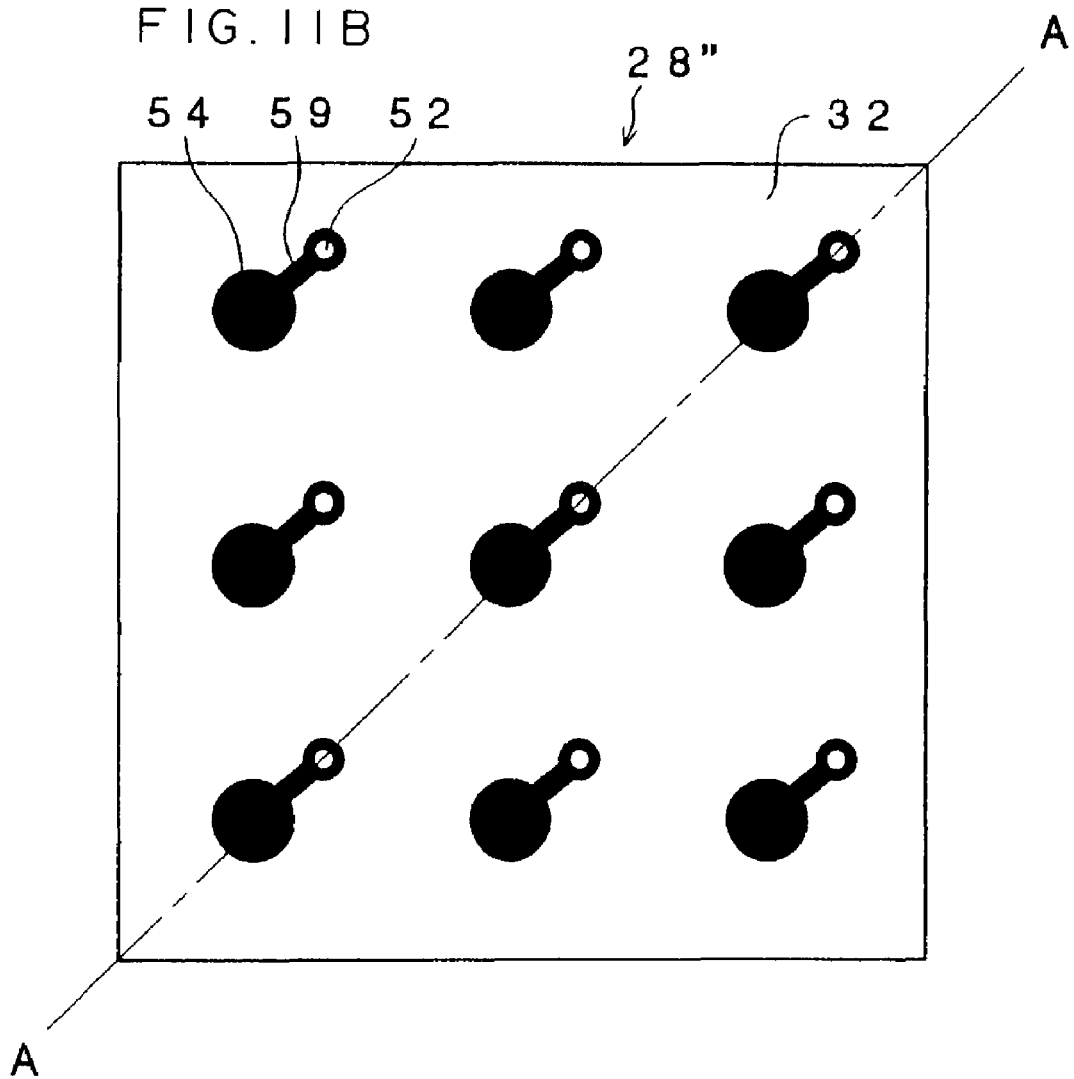
FIG. 11B is a plan view of the interposer substrate.

FIG. 11A is a partial sectional view of an interposer substrate 28" according to the modification, and FIG. 11B is a plan view thereof. The sectional view in FIG. 11A is taken along line A—A in FIG. 11B.

As shown in FIG. 11A, the interposer substrate 28" includes the through holes 52 formed in the substrate 32. The connecting pads 54 are formed at positions apart from the through holes 52. The through holes 52 are connected to the connecting pads 54 via wiring patterns 59.

Next, a method for producing the interposer substrate 28" is described.

Figure 12A:
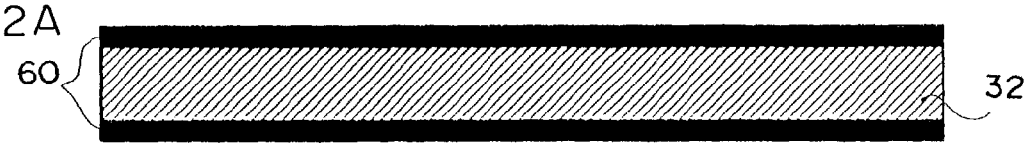
FIGS. 12A–12G are diagrams for explaining a process for producing the interposer substrate according to the modification of the invention.
Figure 12B:
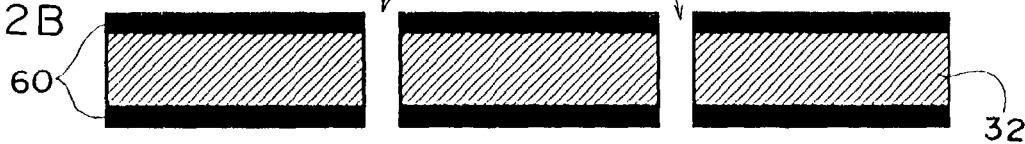

First, as shown in FIG. 12A, metal foils 60 are formed on both sides of the substrate 32 by CVD, or the like. Then, as shown in FIG. 12B, the through holes 52 are formed, for example, by drilling.

Figure 12C:
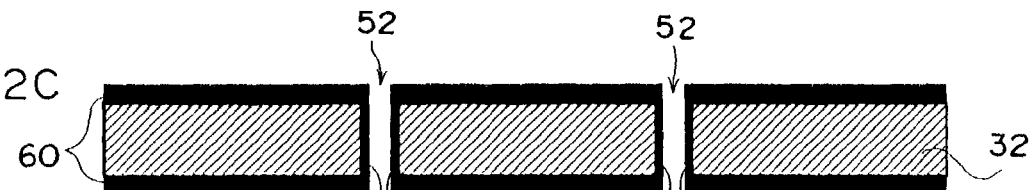
Figure 12D:
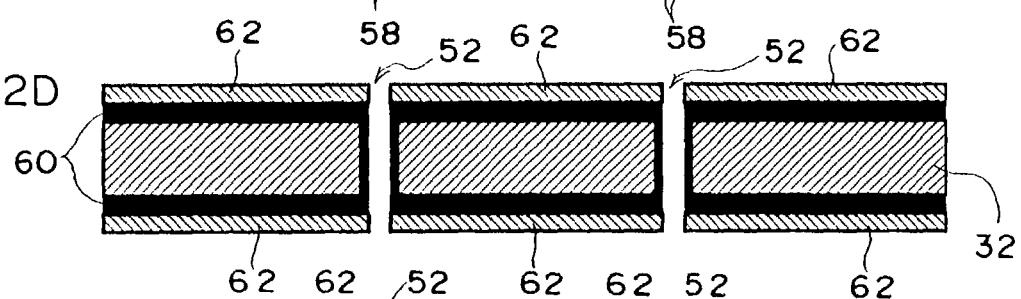

Next, as shown in FIG. 12C, the conductive film 58 is formed on the inner wall of each of the through holes 52, thereby connecting the metal foil 60 on each side of the through hole with each other. Then, as shown in FIG. 12D, a photoresist 62 is applied on both sides of the substrate 32.

Figure 12E:
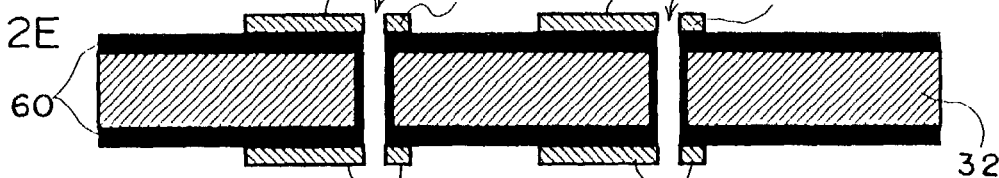
Figure 12F:
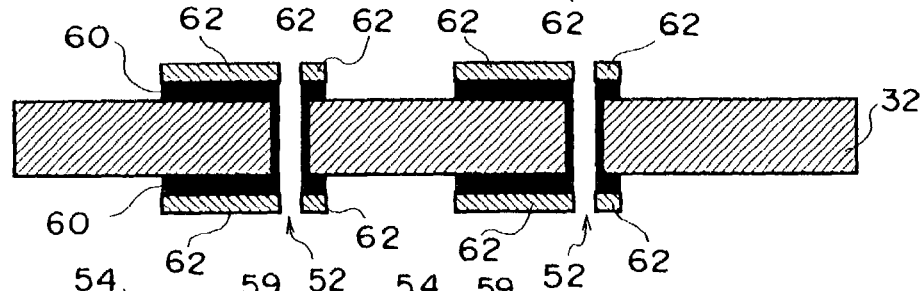
Figure 12G:
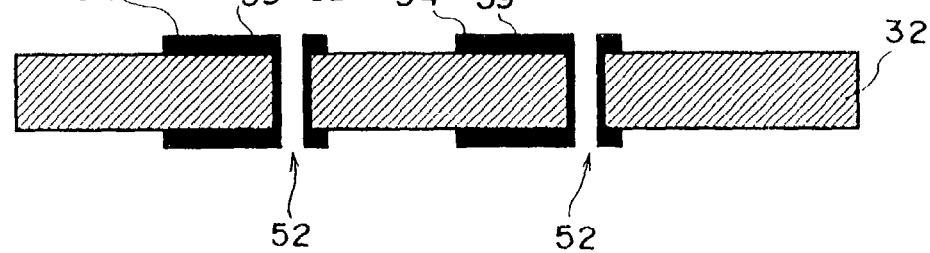

Then, the photoresist 62 is exposed to light, and then is developed to remove portions of the photoresist covering portions of the metal foils wished to be removed, as shown in FIG. 12E. Subsequently, unnecessary portions of the metal foil are removed by etching as shown in FIG. 12F, and remaining photoresist is removed as shown in FIG. 12G.

As described above, the interposer substrate 28" can be produced by ordinary so-called photolithography, and therefore, production costs thereof can be suppressed. Further, since there is no need of a filler, the interposer substrate 28" can be produced inexpensively.

What is claimed is:

1. A semiconductor device comprising:
    a tabular base substrate having a planar surface portion;
    a wiring pattern formed directly on the planar surface portion of said base substrate and including first and second portions;
    a semiconductor chip disposed on the planar surface portion of said base substrate;
    an electrode provided on said semiconductor chip;
    a conductive wire extending between said electrode on said semiconductor chip and the first portion of said wiring pattern on the planar surface portion of said base substrate, the conductive wire directly connected to the first portion of said wiring pattern;
    an interposer substrate defined by an insulating body having opposite top and bottom surfaces, wherein the bottom surface of said interposer substrate confronts the planar surface portion of said base substrate over said wiring pattern, wherein said interposer substrate includes an opening in which said semiconductor chip is positioned, wherein said interposer substrate includes a conductor extending therethrough from the top surface to the bottom surface, and wherein said conductor at the bottom surface of said interposer substrate contacts the second portion of said wiring pattern; and
    an external electrode electrically connected to said conductor at the top surface of said interposer substrate.

2. The semiconductor device according to claim 1, wherein the conductor comprises a conductive material embedded in a through hole provided in the interposer substrate.

3. The semiconductor device according to claim 1, further comprising a through hole formed in the interposer substrate and including a side wall, wherein the conductor comprises a conductive film formed on the side wall and a conductive connecting pad formed on the bottom surface of the interposer substrate so as to surround the through hole and electrically connecting to said conductive film.

4. The semiconductor device according to claim 3, wherein a filler is filled in said through hole.

5. The semiconductor device according to claim 3, wherein the connecting pad is disposed on the second portion of said wiring pattern on the base substrate.

6. The semiconductor device according to claim 1, the interposer substrate comprising
    a through hole formed therethrough and including a side wall, on which a conductive film forming the conductor is formed;
    a conductive connecting pad disposed on the interposer substrate at a position offset from said through hole; and
    a connection wiring pattern electrically connecting the conductive film and said conductive connecting pad.

7. The semiconductor device according to claim 1, wherein the base substrate comprises a conductive substrate and an insulating layer formed on the conductive substrate.

8. The semiconductor device according to claim 7, wherein the conductive substrate comprises a metal.

9. The semiconductor device according to claim 7, wherein the insulating layer comprises a polyimide resin.

10. The semiconductor device according to claim 1, wherein the opening is formed at a substantial center of the base substrate.

11. The semiconductor device according to claim 1, wherein the opening comprises a hole.

12. The semiconductor device according to claim 1, wherein the opening comprises a depression.

13. The semiconductor device according to claim 1, wherein the external electrode comprises a solder ball.

14. The semiconductor device according to claim 1, wherein the semiconductor chip is molded by a sealing resin and the opening has a size sufficient for accommodating all of the sealing resin.

15. The semiconductor device according to claim 1, wherein the conductive wire contacts the first portion of said wiring pattern within the opening of said interposer substrate.

* * * * *